United States Patent [19]
Pace

[11] Patent Number: 4,577,159
[45] Date of Patent: Mar. 18, 1986

[54] LOW DRIFT BROADBAND AMPLIFIER

[75] Inventor: Noel M. Pace, Loveland, Colo.

[73] Assignee: Hewlett-Packard Company, Palo Alto, Calif.

[21] Appl. No.: 635,321

[22] Filed: Jul. 27, 1984

[51] Int. Cl.[4] .............................................. H03F 1/02
[52] U.S. Cl. ........................................ 330/9; 330/149
[58] Field of Search ..................... 330/9, 76, 103, 149, 330/259, 290

[56] References Cited
U.S. PATENT DOCUMENTS
4,430,622  2/1984  Simoes ................................... 330/9

Primary Examiner—James B. Mullins
Assistant Examiner—G. Wan
Attorney, Agent, or Firm—William E. Hein

[57] ABSTRACT

An amplifier having a low DC drift characteristic incorporates a DC drift compensator which periodically samples the DC input offset voltage of the amplifier, holds the sampled value, then corrects the amplifier's input signal by the amount of the sampled value.

3 Claims, 5 Drawing Figures

LOW DRIFT BROADBAND AMPLIFIER

BACKGROUND OF THE INVENTION

Many applications require an amplifier to handle DC as well as AC input signals. In such applications, the DC input offset voltage and drift may introduce significant errors. Bipolar amplifiers have offsets on the order of millivolts and drifts on the order of microvolts/degree C., but have poor input impedance characteristics. FET amplifiers display better input impedance characteristics, but do not have satisfactory input offset voltages or drifts.

One previous solution to the drift problem was the use of a chopper amplifier. The major disadvantage of this technique is the bandwidth limitation. The upper limit of the bandwidth is determined by the "chopping" frequency, generally not more than a few hundred kilohertz.

Another previous solution was to combine a low pass amplifier in parallel with a high pass amplifier to handle input signals from DC to high frequency. One disadvantage of this arrangement is diminished performance near the crossover frequency of the two amplifiers. A second disadvantage is that close thermal matching of the transistors in the input stages of the two amplifiers is needed for satisfactory performance.

One application in which an amplifier with very low DC drift finds utility is the voltmeter. Most voltmeters require separate amplifiers for DC and AC signals because of the difficulty of achieving very low DC drift while maintaining adequate high frequency performance. A major savings in components would result if a single broadband amplifier could handle both DC and AC measurements.

BRIEF SUMMARY OF THE INVENTION

The present invention provides an amplifier having a DC drift of less than 1 microvolt and a frequency range of DC to 100 MHz. This amplifier incorporates a DC drift compensator which samples the DC input offset voltage of the amplifier, holds the sampled value, then corrects the amplifier's input signal by the amount of the sampled value. Any DC drift is compensated for by the periodic resampling of the DC input offset voltage.

DETAILED DESCRIPTION OF THE INVENTION

Figure 1:
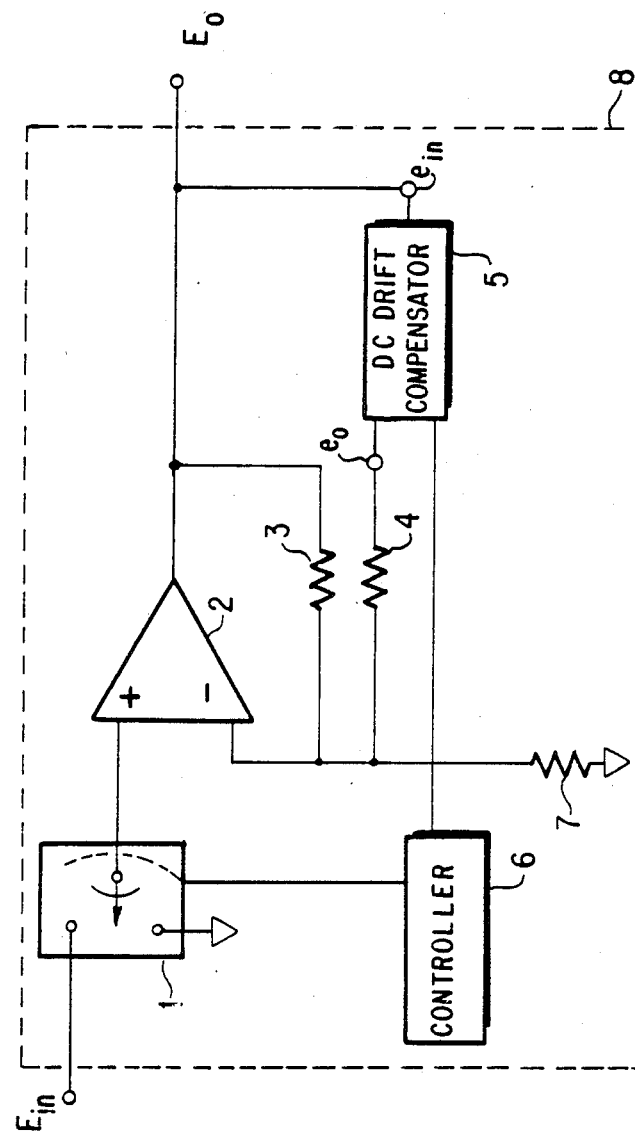
FIG. 1 is a general circuit diagram of an amplifier which incorporates a DC drift compensator.

FIG. 1 depicts an amplifier 8 that incorporates a DC drift compensator in a voltage series feedback configuration. A switch 1, that may comprise, for example, an externally controlled single pole double throw switch, is controlled by a controller 6. Switch 1 operates so as to connect either an input $E_{in}$ or a source of ground potential to a non-inverting input of a radio frequency amplifier 2. The radio frequency amplifier 2 may comprise any of a number of commercially available amplifiers having a high input impedance, a high forward gain and a bandwidth from DC to 100 MHz or higher. A resistor 3 is connected between an output $E_o$ and an inverting input of the radio frequency amplifier 2.

A DC drift compensator 5 comprises an externally controlled circuit which reduces the DC drift of radio frequency amplifier 2. An input $e_{in}$ of DC drift compensator 5 is connected to output $E_o$ of radio frequency amplifier 2. The DC drift compensator 5 is controlled by controller 6. A resistor 4 is connected between an output $e_o$ of DC drift compensator 5 and the inverting input of radio frequency amplifier 2. A resistor 7 is connected between the inverting input of radio frequency amplifier 2 and a source of ground potential.

The controller 6 may be readily implemented by any person having ordinary skill in the art of logic design to generate a control signal for driving switch 1 and DC drift compensator 5 as described below.

Figure 2:
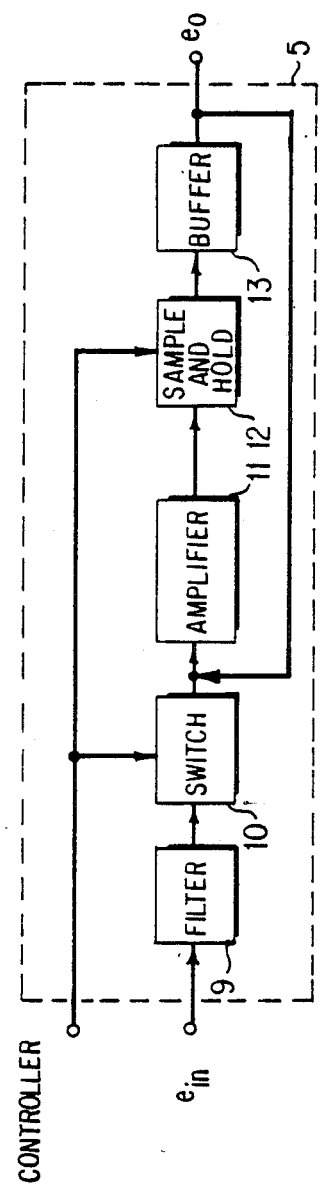
FIG. 2 is a block diagram of the DC drift compensator employed in the amplifier of FIG. 1.

The internal functions of the DC drift compensator 5 are illustrated in FIG. 2. The input $e_{in}$ is applied to a filter 9. An output of filter 9 is connected to an input of a switch 10. An output of switch 10 is connected to an input of an amplifier 11. An output of amplifier 11 is connected to an input of a sample and hold circuit 12. An output of sample and hold circuit 12 is connected to an input of a buffer 13. The output of buffer 13 is connected to the input of amplifier 11 to provide negative feedback. A controller is connected to switch 10 and sample and hold circuit 12.

Referring now to both FIG. 1 and FIG. 2, operation of amplifier 8 is such that when controller 6 controls switch 1 to connect the non-inverting input of radio frequency amplifier 2 to a source of ground potential, DC drift compensator 5 is simultaneously enabled by controlling switch 10 to apply the output of filter 9 to amplifier 11. Since the non-inverting input of radio frequency amplifier 2 is connected to a source of ground potential, output $E_o$ is an amplified DC input offset voltage referred to that non-inverting input. The DC drift compensator 5 samples output $E_o$ and holds the sampled value at output $e_o$. The controller 6 then controls switch 1 to connect input $E_{in}$ to the non-inverting input of radio frequency amplifier 2 and simultaneously disables DC drift compensator 5 by controlling switch 10 to disconnect the output of filter 9 from amplifier 11. Since the DC input offset voltage was previously held at the inverting input of radio frequency amplifier 2 by DC drift compensator 5, radio frequency amplifier 2 operates to subtract this value from input $E_{in}$. The output $E_o$ of radio frequency amplifier 2 is thus independent of the DC input offset voltage. Any drift in the DC input offset voltage is compensated for by periodically reenabling DC drift compensator 5, as described above, to resample the DC input offset voltage.

Figure 3:
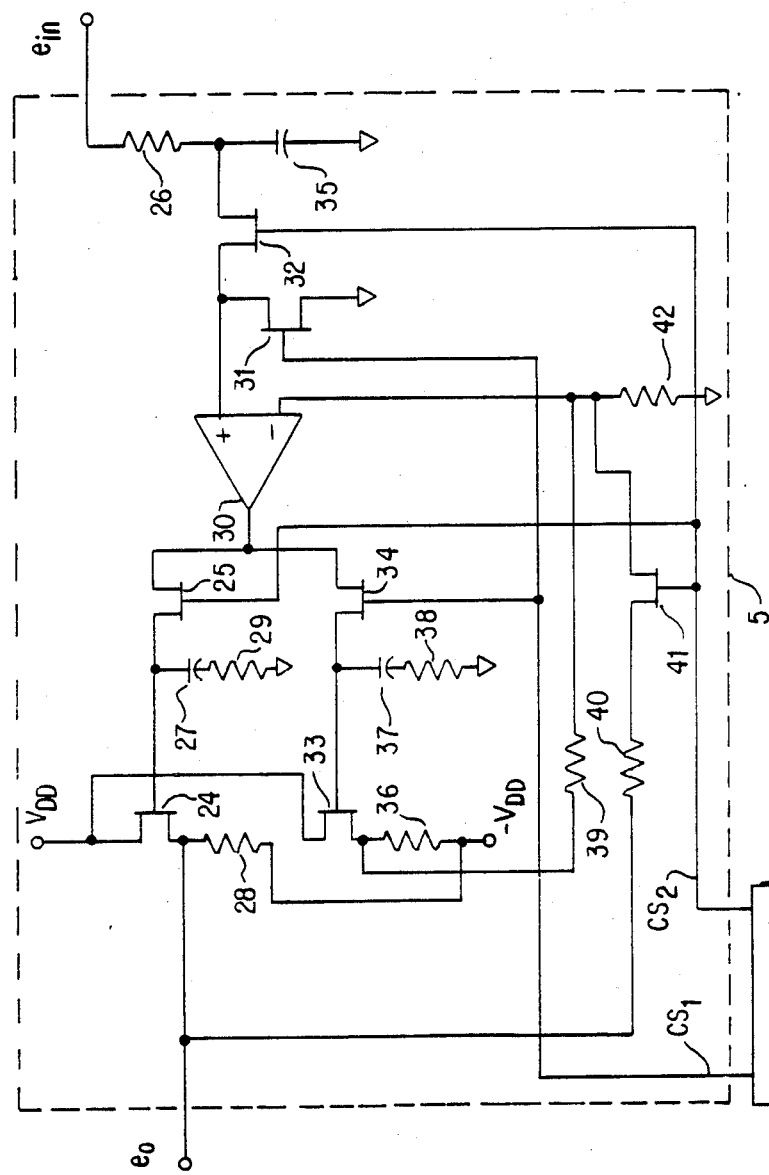
FIG. 3 is a detailed circuit diagram of the preferred embodiment of the DC drift compensator of FIG. 2 constructed in accordance with the present invention.

The circuit details of DC drift compensator 5 constructed in accordance with the preferred embodiment of the present invention are shown in FIG. 3. A resistor 26 is connected between the input $e_{in}$ and the drain element of a pass transistor 32. A capacitor 35 is connected between the drain element of pass transistor 32 and a source of ground potential. The source element of pass transistor 32 is connected to a non-inverting input of a differential amplifier 30. The differential amplifier 30 may comprise any of a number of commercially available monolithic or other differential amplifiers having a high forward gain and a high input impedance. The drain element of a transistor 31 is connected to the non-inverting input of differential amplifier 30. The source element of transistor 31 is connected to a source of ground potential.

The drain element of a pass transistor 34 is connected to an output of differential amplifier 30. A series combination of a capacitor 37 and a resistor 38 is connected between the source element of pass transistor 34 and a source of ground potential. The source element of pass transistor 34 is also connected to the gate element of an output transistor 33. The drain element of output transistor 33 is connected to a source of supply voltage $V_{DD}$. A resistor 36 is connected between the source element of output transistor 33 and a source of negative supply voltage $-V_{DD}$. A resistor 39 is connected between the source element of output transistor 33 and an inverting input of differential amplifier 30. A resistor 42 is connected between the inverting input of differential amplifier 30 and a source of ground potential.

The drain element of a pass transistor 25 is connected to the output of differential amplifier 30. A series combination of a capacitor 27 and a resistor 29 is connected between the source element of pass transistor 25 and a source of ground potential. The source element of pass transistor 25 is also connected to the gate element of an output transistor 24. The drain element of output transistor 24 is connected to the source of supply voltage $V_{DD}$. A resistor 28 is connected between the source element of output transistor 24 and the source of negative supply voltage $-V_{DD}$. A resistor 40 is connected between the source element of output transistor 24 and the drain element of a pass transistor 41. The source element of pass transistor 41 is connected to the inverting input of differential amplifier 30.

The gate elements of pass transistor 34 and transistor 31 are connected in common to an output $CS_1$ of the controller 6. The gate elements of pass transistors 25, 32 and 41 are connected in common to an output $CS_2$ of controller 6.

Figure 5:
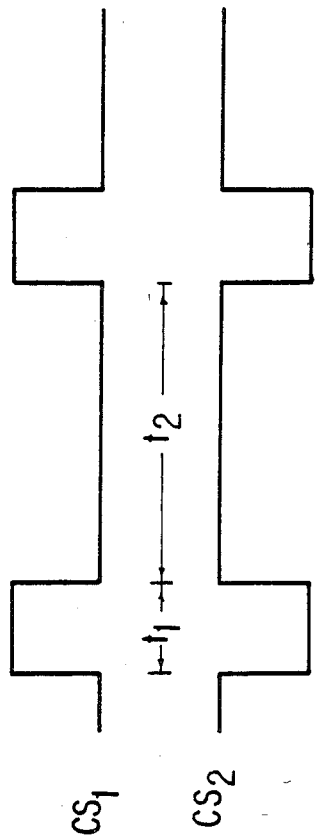
FIG. 5 is a timing diagram depicting the control signals generated by the controller of FIGS. 3 and 4.

The detailed theory of operation of the DC drift compensator 5 shown in FIG. 3 may be understood with reference to the timing diagram of FIG. 5. The control signals $CS_1$ and $CS_2$ shown in FIG. 5 are generated by the controller 6. Controller 6 incorporates conventional logic which is well within the ordinary skill of the logic designer to generate control signals $CS_1$ and $CS_2$. The control signals $CS_1$ and $CS_2$ are synchronized so as to form a first sampling window $t_1$ and a second sampling window $t_2$. At the beginning of sampling window $t_1$, control signal $CS_1$ rises and turns on transistor 31 and pass transistor 34 while control signal $CS_2$ simultaneously turns off pass transistors 25, 32 and 41. Since transistor 31 is turned on and pass transistor 32 is turned off, the non-inverting input of differential amplifier 30 is thereby connected to a source of ground potential and a DC offset voltage referred to that input is amplified. The pass transistor 34 applies the output from differential amplifier 30 to capacitor 37. The pass transistor 34 is simply a means by which the output of differential amplifier 30 is sampled and capacitor 37 in series with resistor 38 is a means for storing that output which is sampled by pass transistor 34.

The charge held by capacitor 37 turns on output transistor 33 and a signal $e_o'$ appears at the source element thereof. The capacitor 37 does not discharge significantly due to the buffering effect of the high impedance gate element of output transistor 33. Consequently, output transistor 33 remains on following the first occurrence of sampling window $t_1$. The resistors 39 and 42 provide for voltage series feedback of signal $e_o'$ to the inverting input of differential amplifier 30. Since the gain of differential amplifier 30, for purposes of analysis, is assumed to be infinite, signal $e_o'$ is effectively limited by resistors 39 and 42 and is described in accordance with the equation:

$$e_o' = v_i(R_{42} + R_{39})/R_{42} \qquad (1)$$

where $R_{39}$ designates the value of resistor 39, $R_{42}$ designates the value of resistor 42, and $v_i$ designates a DC offset voltage referred to the non-inverting input of differential amplifier 30.

Referring again to FIG. 5, as sampling window $t_1$ ends, sampling window $t_2$ begins. At the beginning of sampling window $t_2$, control signal $CS_1$ turns off transistor 31 and pass transistor 34 while control signal $CS_2$ turns on pass transistors 25, 32 and 41. Since pass transistor 32 is turned on and transistor 31 is turned off, the non-inverting input of differential amplifier 30 thereby receives input $e_{in}$ as well as the DC offset voltage $v_i$. The pass transistor 32 and transistor 31 operate during the two sampling windows as a means for alternately switching the non-inverting input of differential amplifier 30 between a source of ground potential and input $e_{in}$. The resistor 26 and capacitor 35 operate as a low pass radio frequency filter which prevents high frequency signals from coupling into DC drift compensator 5 during sampling window $t_2$. The pass transistor 25 applies the output of differential amplifier 30 to capacitor 27. The pass transistor 25 is simply a means by which the output of differential amplifier 30 is sampled and capacitor 27 in series with resistor 29 is a means for storing that output which is sampled by pass transistor 25.

The charge held by capacitor 27 turns on output transistor 24 and the output $e_o$ appears at the source therof. The capacitor 27 does not discharge significantly due to the buffering effect of the high impedance gate element of pass transistor 24. Consequently, output transistor 24 remains on following the first occurrence of sampling window $t_2$. The resistor 40 and the parallel combination of resistors 39 and 42 provide for voltage series feedback of output $e_o$ to the inverting input of differential amplifier 30. Since the gain of differential amplifier 30 is assumed to be infinite, output $e_o$ is limited by resistor 40 and the parallel combination of resistors 39 and 42. Output $e_o$ is thus represented by the equation:

$$e_o = (e_{in} + v_i)(R_{40} + (R_{39}//R_{42}))/(R_{39}//R_{42}) \qquad (2)$$

where $(R_{39}//R_{42}) = (R_{39} \times R_{42})/(R_{39} + R_{42})$. If $R_{42} << R_{39}$, then $(R_{39}//R_{42})$ is approximately equal to $R_{42}$ and equation (2) is simplified:

$$e_o = (e_{in} + v_i)((R_{40} + R_{42})/R_{42}). \qquad (3)$$

In actual operation, there is a signal at the inverting input of differential amplifier 30 during sampling window $t_2$. This signal is the amplified DC offset voltage of differential amplifier 30 which is represented by equation (1). The differential amplifier 30 operationally subtracts the signal received at its inverting input from the signal received at its non-inverting input. This operational subtraction is equivalent to subtracting equation (1) above from equation (3):

$$e_o = (e_{in} + v_i)((R_{40} + R_{42})/R_{42}) - v_i((R_{39} + R_{42})/R_{42}). \quad (4)$$

If $R_{39} = R_{40}$ then equation (4), which is the transfer function of the DC drift compensator 5, is simplified:

$$e_o = e_{in}((R_{40} + R_{42})/R_{42}). \quad (5)$$

The effect of the completion of sampling window $t_2$ is that the DC offset voltage $v_i$ is eliminated from the transfer function of the DC drift compensator 5 and any drift in that DC offset voltage is automatically compensated for by periodic resampling.

To summarize, the DC drift compensator 5 operates in either of two modes. During sampling window $t_1$, DC drift compensator 5 operates in an internal compensation mode whereby it samples the DC offset voltage $v_i$ of the differential amplifier 30 and stores the sampled value. During sampling window $t_2$, DC drift compensator 5 operates in a sample and hold mode whereby it samples the input $e_{in}$ and produces the output $e_o$ independently of the DC offset voltage $v_i$.

The elimination of the DC offset voltage $v_i$ from the transfer function of the DC drift compensator 5 is limited by the gain differences in the two feedback paths. The DC offset voltage $v_i$ is sampled precisely during sampling window $t_1$ because resistor 40 is isolated by pass transistor 41, which is turned off. However, during sampling window $t_2$, the sampling of input $e_{in}$ combined with the DC offset voltage $v_i$ is affected by the fact that resistor 39 is in parallel with resistor 42. Assuming that $R_{42} << R_{39}$, the measurement error caused by the parallel combination of $R_{42}$ and $R_{39}$ will be small (e.g. if $R_{39} = 100 R_{42}$, the error will be 1%).

Figure 4:
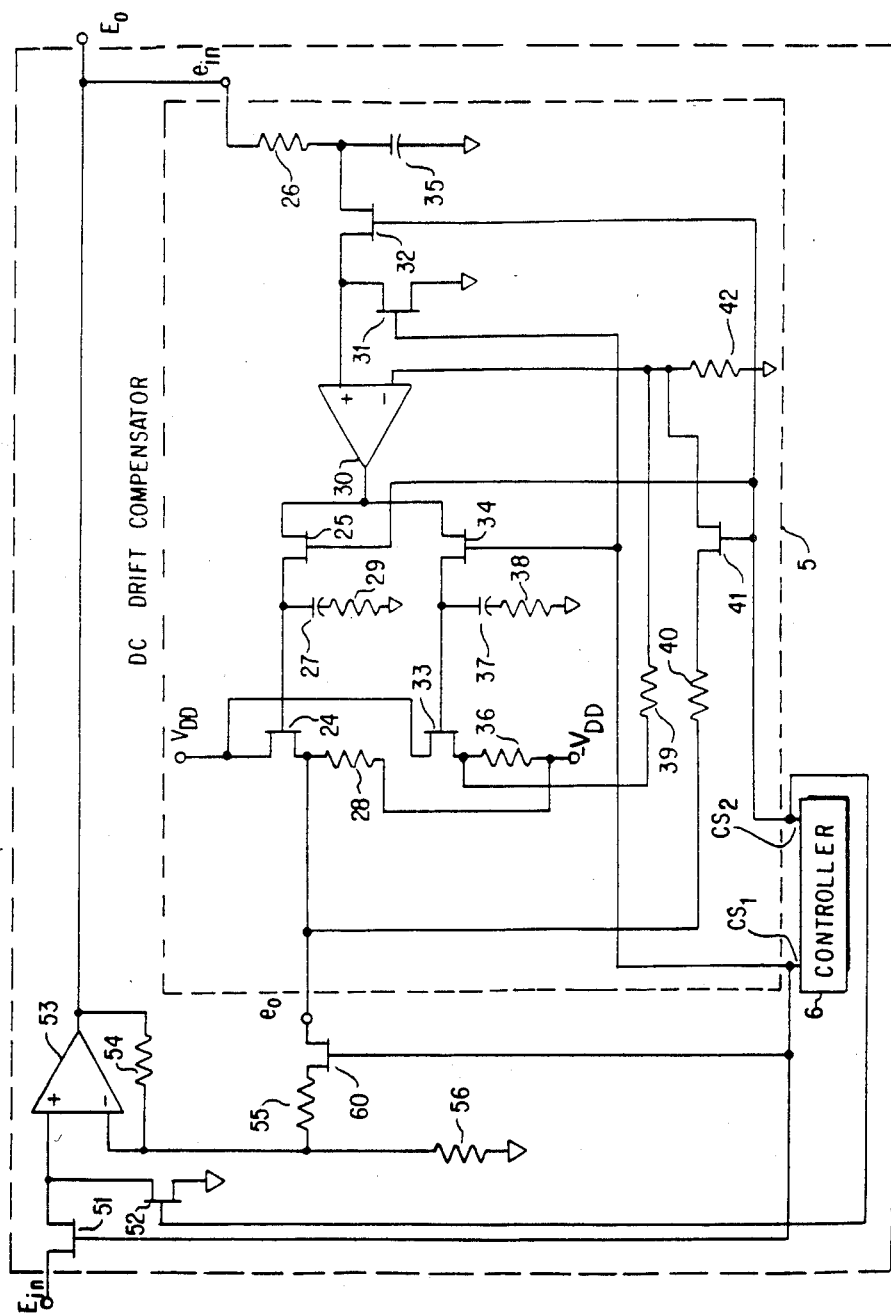
FIG. 4 is a detailed circuit diagram of the preferred embodiment of a broadband amplifier constructed in accordance with the present invention.

FIG. 4 shows the preferred embodiment of a broadband amplifier 61 which incorporates the DC drift compensator 5 and the controller 6 shown in FIG. 3. The drain element of a pass transistor 51 is connected to an input $E_{in}$. The source element of pass transistor 51 is connected to a non-inverting input of a radio frequency amplifier 53. The radio frequency amplifier 53 may comprise any of a number of commercially available or other amplifiers having high input impedance, high forward gain and a bandwidth from DC to 100 MHz or higher. The drain element of a transistor 52 is connected to the non-inverting input of radio frequency amplifier 53. The source element of transistor 52 is connected to a source of ground potential. A resistor 54 is connected between an output $E_o$ and an inverting input of radio frequency amplifier 53. Input $e_{in}$ of the DC drift compensator 5, described above, is connected to output $E_o$. The drain element of a pass transistor 60 is connected to output $e_o$ of DC drift compensator 5. A resistor 55 is connected between the source element of pass transistor 60 and the inverting input of radio frequency amplifier 53. A resistor 56 is connected between the inverting input of radio frequency amplifier 53 and a source of ground potential.

The output $CS_1$ of controller 6, described above, is connected to the gate elements of pass transistors 51 and 60. The output $CS_2$ of controller 6 is connected to the gate element of transistor 52.

The operation of broadband amplifier 61 may be understood with reference to the timing diagram of FIG. 5. At the beginning of sampling window $t_1$, control signal $CS_1$ rises thereby switching DC drift compensator 5 to internal compensation mode during which it samples and holds the DC offset voltage $v_i$ of differential amplifier 30. Simultaneously, pass transistors 51 and 60 are turned on by control signal $CS_1$ and transistor 52 is turned off by control signal $CS_2$. Since pass transistor 51 is turned on and transistor 52 is turned off, the non-inverting input of radio frequency amplifier 53 is thereby connected to input $E_{in}$. The radio frequency amplifier 53 therefore amplifies both input $E_{in}$ and a DC offset voltage $V_i$ referred to the noninverting input thereof. Assuming that the gain of radio frequency amplifier 53 is infinite, for purposes of analysis, the output $E_o$ is limited by resistor 54 and the parallel combination of resistors 55 and 56, represented by the equation:

$$E_o = (E_{in} + V_i)(R_{54} + (R_{55}//R_{56}))/(R_{55}//R_{56}) \quad (6)$$

where $(R_{55}//R_{56}) = (R_{55} \times R_{56})/(R_{55} + R_{56})$. If $R_{56} << R_{55}$, then $(R_{55}//R_{56})$ is approximately equal to $R_{56}$ and equation (6) is simplified:

$$E_o = (E_{in} + V_i)((R_{54} + R_{56})/R_{56}). \quad (7)$$

At the beginning of sampling window $t_2$, control signal $CS_1$ switches DC drift compensator 5 to sample and hold mode and turns off pass transistors 51 and 60 while control signal $CS_2$ turns on transistor 52. Since pass transistor 51 is turned off and transistor 52 is turned on, the non-inverting input of radio frequency amplifier 53 is thereby connected to a source of ground potential and the DC offset voltage $V_i$ is amplified. The output $E_o$ is limited by resistor 54 and resistor 56 as represented in the equation:

$$E_o = V_i((R_{54} + R_{56})/R_{56}). \quad (8)$$

During sampling window $t_2$, the DC drift compensator 5 samples output $E_o$ shown in equation (8) and stores the sampled value at output $e_o$. The pass transistor 60 remains off during sampling window $t_2$ to insure that the DC offset voltage $V_i$ is accurately sampled.

As sampling window $t_2$ ends, a subsequent sampling window $t_1$ begins, as described above. Control signal $CS_1$ turns on pass transistors 51 and 60, which connects input $E_{in}$ to the non-inverting input of radio frequency amplifier 53 and connects output $e_o$ to the inverting input thereof. The radio frequency amplifier 53 operationally subtracts the signal received at its inverting input from that received at its non-inverting input and amplifies the difference. This operational subtraction is equivalent to subtracting equation (8) from equation (7):

$$E_o = (E_{in} + V_i)((R_{54} + R_{56})/R_{56}) - V_i((R_{54} + R_{56})/R_{56}). \quad (9)$$

$$E_o = E_{in}((R_{54} + R_{56})/R_{56}) \quad (10)$$

Equation (10) represents the transfer function of the broadband amplifier 61 and is independent of the DC offset voltage $V_i$. Any drift in the DC offset voltage is automatically compensated for by DC drift compensator 5, which resamples DC offset voltage $V_i$ during each subsequent sampling window $t_2$.

To summarize, the broadband amplifier 61 operates in either of two modes. During sampling window $t_1$, the broadband amplifier 61 operates in an amplifying mode whereby the input $E_{in}$ is amplified and the output $E_o$ is produced independently of the DC offset voltage $V_i$ of radio frequency amplifier 53. The DC drift compensator 5 operates in internal compensation mode during sampling window $t_1$ in which it samples and stores the DC offset voltage $v_i$ of differential amplifier 30. During sampling window $t_2$, the broadband amplifier 61 operates in a sample and hold mode whereby the DC drift compensator 5, which simultaneously operates in a sample and hold mode, samples and stores the DC offset voltage $V_i$ of radio frequency amplifier 53.

I claim:

1. A broadband amplifier, having a low D.C. drift characteristic, the boardband amplifier comprising:
   first differential amplifier means having an inverting input, a non-invverting input and an output;
   first switching means, coupled to the first differential amplifier means, for alternately connecting the non-inverting input of the first differential amplifier means to an input signal during an amplifying mode of operation of the boardband amplifier and to a source of ground potential during a sample and hold mode of operation of the broadband amplifier;
   feedback means, coupled to the first differential amplifier means, for controlling the gain thereof;
   D.C. drift compensation means having first and second sample and hold means, coupled to the first differential amplifier means, said first sample and hold means being operative for storing a D.C. input offset voltage of the first differential amplifier means during the sample and hold mode of operation of the broadband amplifier, said second sample and hold means being operative for storing a D.C. input offset voltage of said D.C. drift compensation means during the amplifying mode of operation of the boardband amplifier; and
   controller means, coupled to the first switching means and to the D.C. drift compensation means, for supplying a control signal for alternately switching the operation of the broadband amplifier between the amplifying mode of operation and the sample and hold mode of operation.

2. A broadband amplifier as in claim 1 wherein the D.C. drift compensation means comprises:
   second differential amplifier means having an inverting input, a non-inverting input and an output;
   second switching means, coupled to the second differential amplifier means and to the controller means, for alternately connecting the non-inverting input of the second differential amplifier means to the output of the first differential amplifier means during the sample and hold mode of operation of the broadband amplifier and to a source of ground potenital during the amplifying mode of operation of the broadband amplifier;
   filtering means, coupled to the second switching means, for excluding high frequency signals during the amplifying mode of operation of the broadband amplifier;
   first buffer means, coupled to the first sample and hold means, for electrically isolating the first sample and hold means;
   first feedback means, coupled to the first buffer means and to the second differential amplifier means, for applying the D.C. input offset voltage stored by the first sample and hold means to the inverting input of the second differential amplifier means;
   second buffer means, coupled to the second sample and hold means, for electrically isolating the second sample and hold means;
   second feedback means, coupled to the second buffer means and to the second differential amplifier means, for controlling the gain of the second differential amplifier means and for applying the D.C. input offset voltage stored by the second sample and hold means to the inverting input of the second differential amplifier means.

3. A circuit for substantially reducing the D.C. drift of an amplifier, the circuit comprising:
   differential amplifier means having an inverting input, a non-inverting input and an output;
   switching means, coupled to the differential amplifier means, for alternately connecting the non-inverting input of the differential amplifier means to an input signal during a sample and hold mode of operation of the circuit and to a source of ground potential during an internal compensation mode of operation of the circuit;
   filtering means, coupled to the switching means, for excluding high frequency signals during the sample and hold mode of operation of the circuit;
   first sample and hold means, coupled to the output of the differential amplifier means, for sampling and storing the DC input offset voltage of the differential amplifier means during the internal compensation mode of operation of the circuit;
   first buffer means, coupled to the the first sample and hold means, for electrically isolating the first sample and hold means;
   first feedback means, coupled to the first buffering means and to the differential amplifier means, for applying the DC input offset voltage stored by the first sample and hold means to the inverting input of the differential amplifier means;
   second sample and hold means, coupled to the output of the differential amplifier means, for sampling and storing an output signal of the differential amplifier means during the sample and hold mode of operation of the circuit;
   second buffer means, coupled to the second sample and hold means, for electrically isolating the second sample and hold means;
   second feedback means, coupled to the second buffering means and to the differential amplifier means, for controlling the gain of the differential amplifier means and for applying the output signal stored by the second sample and hold means to the inverting input of the differential amplifier means; and
   controller means, coupled to the switching means, the first and second sample and hold means and the second feedback means, for producing a control signal for alternately switching the operation of the circuit between the sample and hold mode of operation and the internal compensation mode of operation.

* * * * *

UNITED STATES PATENT AND TRADEMARK OFFICE
CERTIFICATE OF CORRECTION

PATENT NO. : 4,577,159

DATED : March 18, 1986

INVENTOR(S) : Noel M. Pace

It is certified that error appears in the above-identified patent and that said Letters Patent is hereby corrected as shown below:

Column 1, line 10, "C.," should read
-- C, --;

Column 5, line 55, "eo" should read
-- $e_o$ --;

Column 6, line 10, "noninverting" should read
-- non-inverting --;

Column 7, line 13 "boardband" should read
-- broadband --;

Column 7, line 15, "non-invverting" should read
-- non-inverting --;

Column 7, line 20, "boardband" should read
-- broadband --;

Column 7, line 35, "boardband" should read
-- broadband --;

Column 7, line 53, "potenital" should read
-- potential --

UNITED STATES PATENT AND TRADEMARK OFFICE
CERTIFICATE OF CORRECTION

PATENT NO. : 4,577,159

DATED : March 18, 1986

INVENTOR(S) : Noel M. Pace

It is certified that error appears in the above-identified patent and that said Letters Patent is hereby corrected as shown below:

Column 7, line 53, "potenital" should read -- potential --.

Signed and Sealed this

Twelfth Day of August 1986

[SEAL]

Attest:

DONALD J. QUIGG

Attesting Officer

Commissioner of Patents and Trademarks